(12) United States Patent
Xanthopoulos et al.

(10) Patent No.: US 9,721,627 B2
(45) Date of Patent: Aug. 1, 2017

(54) METHOD AND APPARATUS FOR ALIGNING SIGNALS

(71) Applicant: Cavium, Inc., San Jose, CA (US)

(72) Inventors: Thucydides Xanthopoulos, Watertown, MA (US); David D. Lin, Westborough, MA (US); Edward W. Thoenes, Cambridge, MA (US)

(73) Assignee: Cavium, Inc., San Jose, CA (US)

( * ) Notice: Subject to any disclaimer, the term of this patent is extended or adjusted under 35 U.S.C. 154(b) by 542 days.

(21) Appl. No.: 14/046,879

(22) Filed: Oct. 4, 2013

(65) Prior Publication Data

US 2015/0100815 A1  Apr. 9, 2015

(51) Int. Cl.
*G06F 1/10* (2006.01)
*G11C 7/10* (2006.01)
*G11C 7/22* (2006.01)

(52) U.S. Cl.
CPC ............ *G11C 7/1093* (2013.01); *G11C 7/222* (2013.01); *G11C 2207/2254* (2013.01)

(58) Field of Classification Search
CPC . G06F 1/10; G11C 2207/2254; G11C 7/1093; G11C 7/222
See application file for complete search history.

(56) References Cited

U.S. PATENT DOCUMENTS

| | | | |
|---|---|---|---|
| 2005/0047539 A1* | 3/2005 | Oh | H04L 25/068 375/355 |
| 2005/0135527 A1* | 6/2005 | Masui | H04L 7/0338 375/355 |
| 2007/0217559 A1* | 9/2007 | Stott | G11C 7/1051 375/355 |
| 2007/0297551 A1* | 12/2007 | Choi | H04L 7/0337 375/371 |
| 2009/0290671 A1* | 11/2009 | Rea | H04L 25/0272 375/371 |
| 2010/0040182 A1* | 2/2010 | Yang | H03L 7/0814 375/355 |
| 2010/0329045 A1* | 12/2010 | Lee | G06F 13/1689 365/191 |
| 2011/0170644 A1* | 7/2011 | Iqbal | H04L 7/0337 375/355 |
| 2011/0175758 A1* | 7/2011 | Iqbal | H03K 5/1252 341/94 |

(Continued)

*Primary Examiner* — Thomas Lee
*Assistant Examiner* — Chad Erdman
(74) *Attorney, Agent, or Firm* — Hamilton, Brook, Smith & Reynolds, P.C.

(57) ABSTRACT

A method and corresponding apparatus for aligning a data signal with a corresponding clock signal include oversampling the data signal based on the corresponding clock signal and generating corresponding data samples. An indication of skew between the data signal and the corresponding clock signal is detected based on data samples. A variable delay line coupled to the data signal is then adjusted based on the indication of skew detected. According to at least one example implementation, the data signal is oversampled based on the corresponding clock signal and multiple time-shifted versions of the corresponding clock signal. At least one signal of the corresponding clock signal and the multiple time-shifted versions of the corresponding clock signal is employed in sampling the data signal at a potential transition edge of the data signal.

28 Claims, 8 Drawing Sheets

(56) References Cited

U.S. PATENT DOCUMENTS

2012/0170692 A1* 7/2012 Sunaga ................. H04L 27/38
375/340
2014/0375365 A1* 12/2014 Liu ......................... H03K 5/01
327/141

* cited by examiner

METHOD AND APPARATUS FOR ALIGNING SIGNALS

BACKGROUND

In memory interfaces, the data signals are associated with one or more corresponding clock signals. The corresponding clock signals are employed in sampling the data signals.

SUMMARY

A method and corresponding apparatus for aligning a data signal with a corresponding clock signal include oversampling the data signal based on the corresponding clock signal and generating corresponding data samples. An indication of skew between the data signal and the corresponding clock signal is detected based on data samples. A variable delay line coupled to the data signal is then adjusted based on the indication of skew detected.

According to at least one example embodiment, the data signal is oversampled based on the corresponding clock signal and multiple time-shifted versions of the corresponding clock signal. At least one signal of the corresponding clock signal and the multiple time-shifted versions of the corresponding clock signal is employed in sampling the data signal at a potential transition edge of the data signal.

In order to detect skew between the data signal and the corresponding clock signal, one or more subsets of data samples are selected. The skew is determined based on the one or more selected subsets of data samples. At least one sample in each selected subset is associated with a corresponding potential transition edge of the data signal. The values of the sample(s) associated with potential transition edge(s) is employed in detecting skew.

Once a skew is detected, a delay value, or an indication thereof, associated with the variable delay line, is incremented or decremented. Once the variable delay line is adjusted, the apparatus waits for a number of clock cycles before repeating the alignment process again.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

In high performance memory interfaces, the data (DQ) and data strobe (DQS) signals are expected to have a specific fixed phase relationship as they arrive at either the memory controller or memory components. The phase relationship between DQ and DQS signals is usually preserved along the routes between the on-chip memory controller and the off-chip memory components by carefully designed layouts of the integrated circuit (IC) on the chip and the printed circuit board (PCB) off the chip. At a data rate around 1333 mega transfers per second (MT/s) and below, the clock frequencies are low enough that setup and hold margins for read and write operations are adequate even with some slight offset from the desired phase relationship between DQ and DQS signals. However, at higher data rates, e.g., 1600, 1833, 2133, and 2400 MT/s, the amount of tolerance for phase offset error is reduced. As such, any phase skew generated from the package, memory module routes, and/or PCB routes between the memory controller and the memory component may be significant enough to diminish the setup and hold time margins of the memory interface.

In existing processor chips, alignment of data signals and corresponding clock signal(s) is usually performed at the software level in the processor. That is, the software running the processor usually compares data read by a corresponding memory controller with expected values and determines whether or not to adjust delay lines associated with the data signals. Such process is usually slow. Also, determining potential adjustment of delay lines based on error in data read by the memory interface does not result in accurate realignment of data signals with corresponding clock signal(s).

In the following, example embodiments of a method and corresponding apparatus for reducing phase shift of DQ bits with respect to a corresponding DQS signal during a read operation are presented. Aligning, or synchronizing, the DQ bits with a corresponding DQS signal, inside the memory controller, increases setup and hold time margin during read cycles. Increasing setup and hold time margins, during read cycles, allows the memory interface to operate at relatively high data rates.

Figure 1:
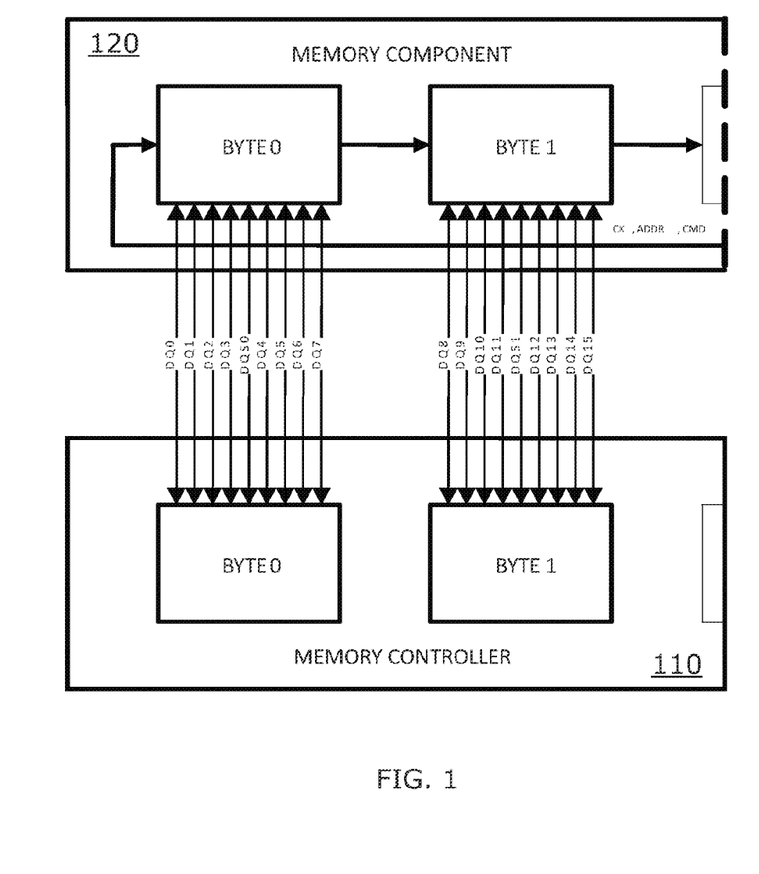
FIG. 1 is a block diagram illustrating transfer of data signals between a memory controller and a memory component, according to at least one example embodiment.

FIG. 1 is a block diagram illustrating transfer of data signals between a memory controller 110 and a memory component, 120 according to at least one example embodiment. In a typical memory design, e.g., synchronous dynamic random access memory (SDRAM) design, each data byte, i.e., eight bits of data, or half data byte, i.e., 4 bits of data, is associated with a corresponding data strobe (DQS) signal. The data bits (DQ) and DQS strobe signal(s) are sent over bidirectional buses that are driven by the memory controller 110 during a memory write and driven by the memory component 120 during a memory read. During a memory write, the memory controller 110 outputs DQS signal(s) and DQ bits to be phase aligned with 90 degree phase shift, also known as a quadrature cycle offset, with respect to each other.

During a memory read, the memory component 120 sends back DQS signal(s) and DQ bits that are edge aligned, and the memory controller 110 then delays the incoming DQS signal(s) by a quarter of a clock period with respect to the corresponding DQ bits, or signals. The DQS signal is typically time-shifted with respect to the corresponding DQ signals because the DQS signal is used to sample the data bits by the memory component 120 during a write operation and by the memory controller 110 during a read operation. The block diagram in FIG. 1 shows two bytes worth of DQ signals and a DQS signal is associated with each byte of DQ signals.

Figure 2:
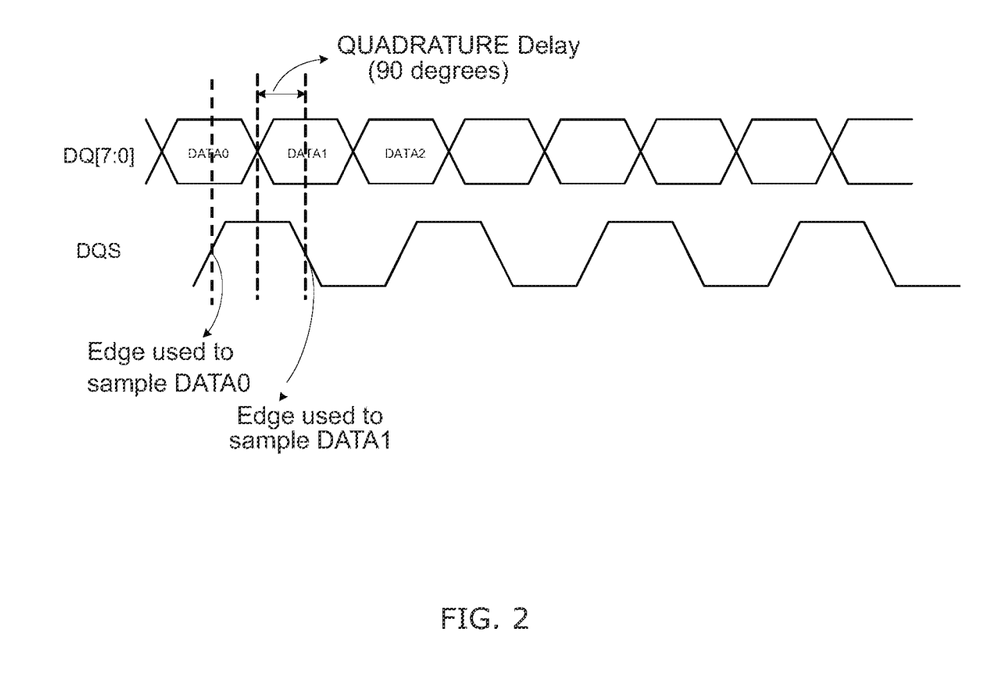
FIG. 2 shows waveforms of DQ signals and a corresponding quadrature phase DQS signal.

FIG. 2 shows waveforms of DQ signals and a corresponding DQS signal, according to at least one example embodiment. The DQS signal is phase shifted by 90 degrees, or equivalently, time-delayed by a quarter of a clock cycle with respect to the data signal. By phase shifting the DQS signal, the transition edges of the DQS signal are aligned with low-voltage and high-voltage phases of the DQ signals. As such, the transition edges of the DQS signal are usually used to sample the DQ signals.

The phase difference between two signals is usually due to the difference in arrival time between the two signals. Layout techniques are typically employed to limit the amount of phase mismatch that is generated between two routes that are both traveling between the same two points. All signals in the same metal layer that follow rules about spacing distance to neighboring signals should travel at about the same speed. If the speed of the signal is fixed, then the length of the route determines when the signal arrives. As such, if it is desired that two signals arrive at the same time, then the lengths of the corresponding routes are typically designed to be the same.

Even when employing layout techniques, systematic and process skew may still exist between the memory component 120 and the memory controller 110. The term skew, as used herein, refers to shift in arrival time, or phase, of simultaneously transmitted signals. According to at least one example embodiment, DQ signals, associated with each byte, are realigned to their corresponding data strobe, DQS, signal inside the memory controller 110 during a read operation. Systematic skew is usually caused by non-random deviations from ideal routes in the memory module, which usually includes multiple memory components 120, the printed circuit board (PCB) connecting the memory controller 110 to the memory components 120, and the memory controller's package. Process skew is usually due to process differences among the transistors that comprise the transmitter and receiver circuits in addition to static supply voltage differences and temperature gradients among such transistors.

Figure 3:
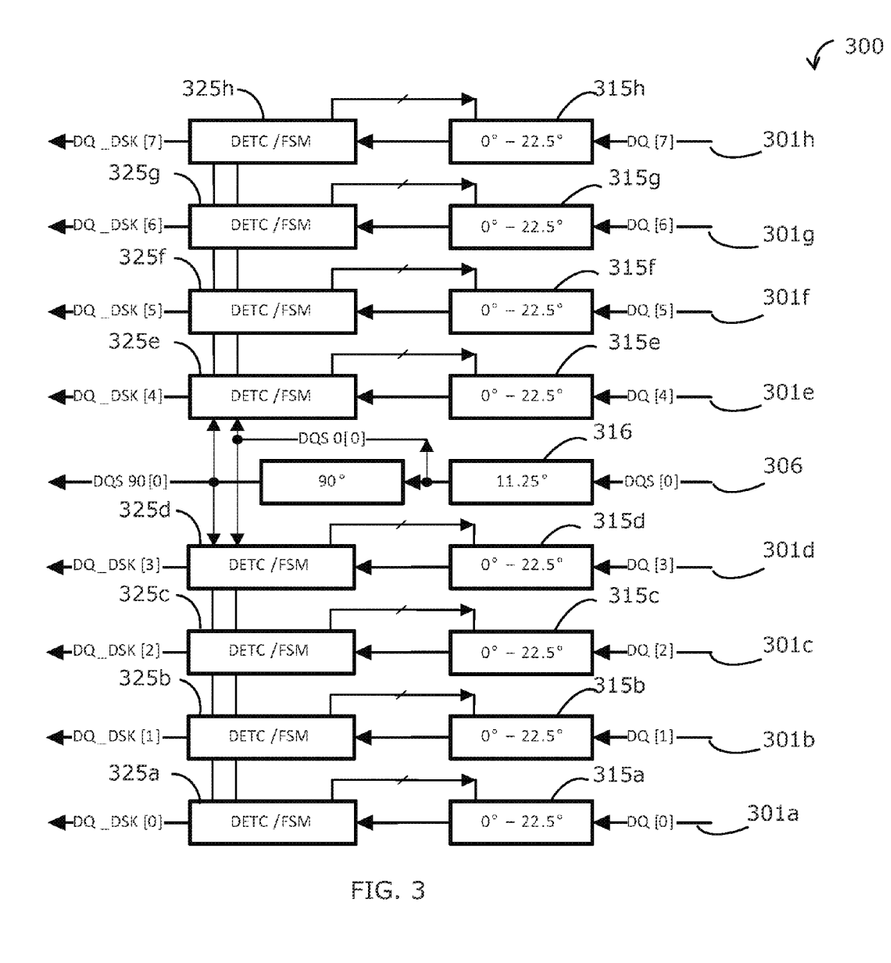
FIG. 3 is a block diagram illustrating a realignment system, or circuit, for realigning DQ signals to corresponding clock signals, according to at least one example embodiment.

FIG. 3 is a block diagram illustrating a realignment system, or circuit, 300 for realigning DQ signals to corresponding DQS signals, according to at least one example embodiment. According to at least one example embodiment, the realignment of DQ signals to their corresponding DQS signal is accomplished by detecting the amount of skew between the DQ and DQS signals and adjusting a variable delay line so that each DQ signal aligns with its corresponding DQS signal. According to at least one example implementation, each DQ signal, e.g., 301a-301h, associated with a single data bit, is coupled to a variable delay line, e.g., 315a-315h, and a hardware detection and decision module, e.g., 325a-325h. Each detection and decision module, e.g., 325a-325h, is configured to detect the phase shift in the corresponding DQ signal, e.g., 301a-301h, and cause the corresponding delay line, e.g., 315a-315h, to be adjusted accordingly. The detection of the skew and the update of the variable delay line happen automatically during read operations based on timing relationship between incoming DQ signals, e.g., 301a-301h, and one or more DQS signals, e.g., 306.

According to at least one example implementation, the variable delay lines, e.g., 315a-315h, may provide phase delay of up to 22.5 degrees as shown in FIG. 3. A person skilled in the art should appreciate that the variable delay lines, e.g., 315a-315h, may be designed differently, for example, with a different delay range. The realignment system 300 also includes a delay line 316 associated with the DQS strobe signal 306. According to at least one example implementation, the delay line 316 is hard-coded with a value equal to the midpoint of the delay range associated with the variable delay lines, e.g., 315a-315h. The variable delay lines, e.g., 315a-315h, for the DQ signals, e.g., 301a-301h, are also initiated or reset to the same midpoint value so that there is maximum dynamic range in the system of +/−11.25 degrees. According to at least one other implementation, the delay ranges and the set/reset delay values may be defined differently.

The variable delay lines, e.g., 315a-315h, are controlled by the corresponding detection and decision modules, or Detector/Finite State Machine (DETC/FSM) blocks, e.g., 325a-325h. Each detection and decision module, e.g., 325a-325h, includes an oversampling circuit configured to oversample the corresponding DQ signal. According to at least one example embodiment, information regarding existing phase difference between the DQ and DQS signals is captured based on samples provided by the oversampling circuit. Each detection and decision module e.g., 325a-325h also includes a finite state machine (FSM) module that controls delay settings based on input from the detector and a current state of the system.

Figure 4:
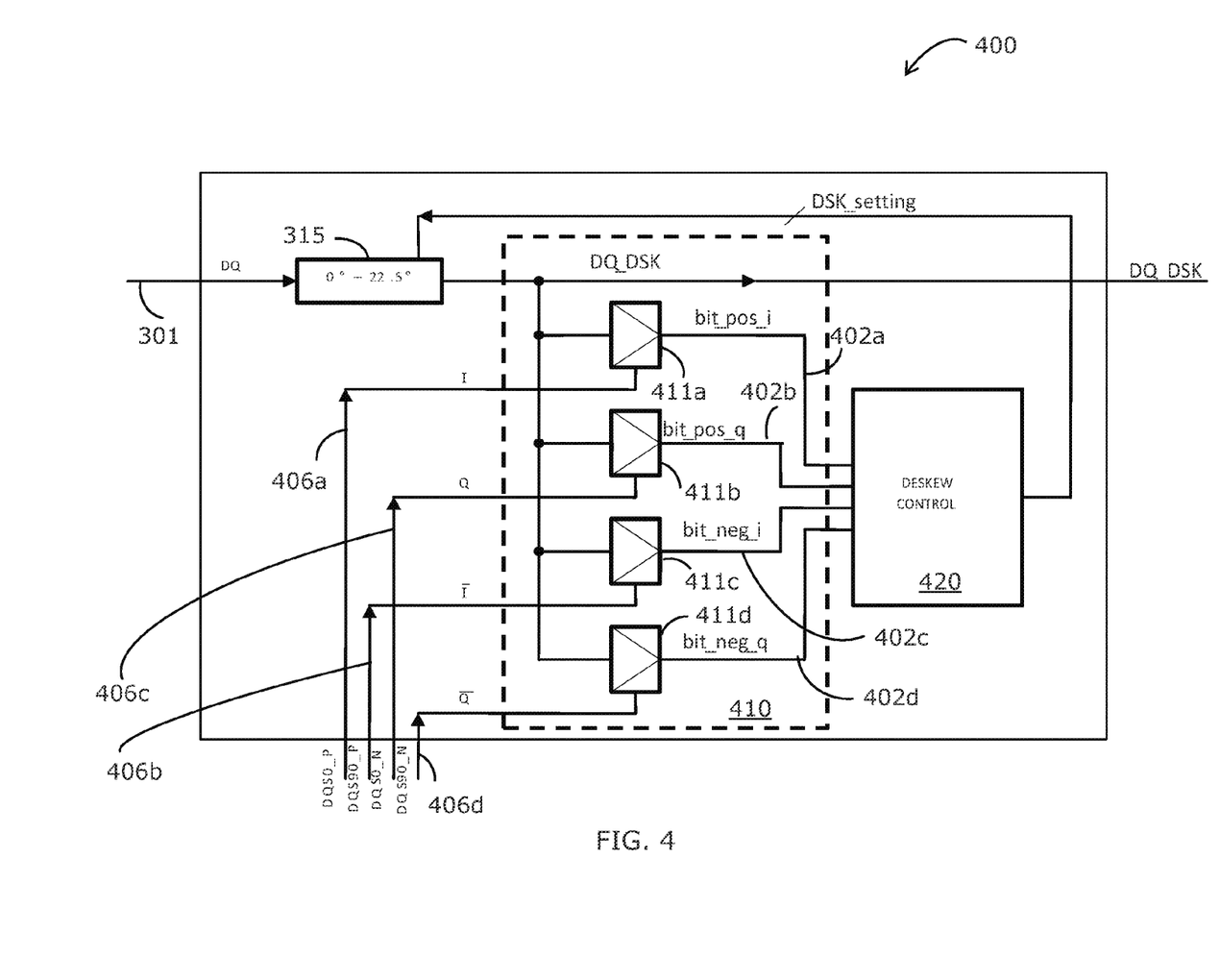
FIG. 4 is a block diagram of a realignment component of the realignment system, or circuit, corresponding to one DQ signal, according to at least one example embodiment.

FIG. 4 is a block diagram of a realignment component 400 of the realignment system, or circuit, 300 corresponding to one DQ signal, according to at least one example embodiment. The realignment component 400 includes a variable delay line 315, an oversampling circuit 410, and a realignment controller 420. According to at least one example implementation, the oversampling circuit 410 is configured to generate four samples, e.g., 402a-402d, of the DQ signal 301 at each clock cycle. The four samples 402a-402d are provided to the controller 420 by the oversampling circuit 410. The controller 420 is configured to determine an adjustment of the variable delay line 315 based on the four samples 402a-402d received from the oversampling circuit 410. In the example shown in FIG. 4, a variable delay line 315 with a tuning range of 0 to 22.5 degrees is used on the DQ signal 301. A person skilled in the art should appreciate that the tuning range may be set depending on each application. According to an example implementation, the variable delay line 315 is initially set to 11.25° phase delay, therefore allowing for the DQ signal 301 to have a skew adjustment of +/−11.25° relative to the DQS signals 406a-406d.

The oversampling circuit 410 includes four sampling flip-flops 411a-411d configured to sample the corresponding DQ signal 301 at different time instances based on four clock cycles. An in-phase positive DQS signal 406a, a quadrature-phase positive DQS signal 406b, an in-phase negative DQS signal 406c, and a quadrature-phase negative DQS signal 406d are fed as clock signals to the flip-flops 411a, 411c, 411b, and 411d, respectively. The DQ signal 301 is fed as input to all four flip-flops 411a-411d. Each flip-flop samples the DQ signal 301 at the rising edge of the corresponding clock signal, e.g., 406a, 406b, 406c, or 406d. Given the phase shifts between the DQS signals 406a-406d, the flip-flops 411a-411d sample the DQ signal 301 at different time instances, therefore resulting in four samples of the DQ signal 301 at each clock cycle.

Figure 5:
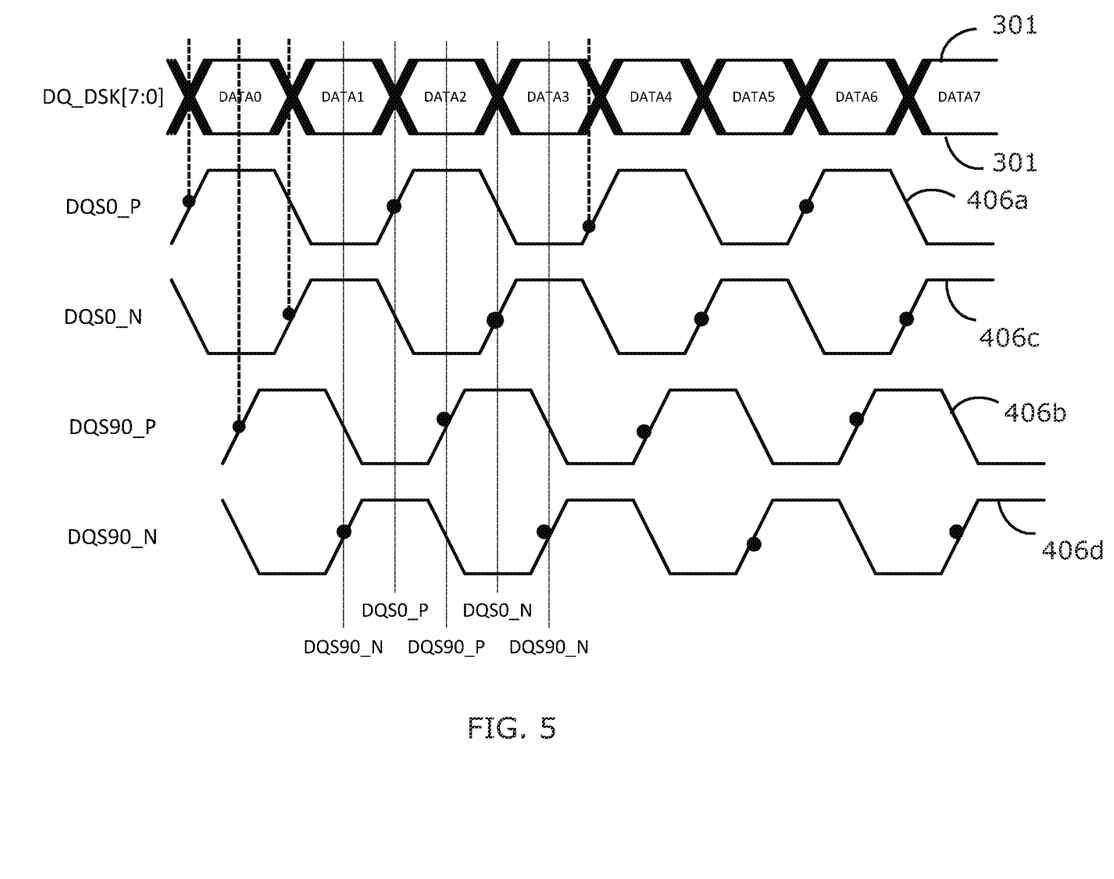
FIG. 5 shows DQ and DQS waveforms illustrating the sampling of the DQ signals based on corresponding in-phase and quadrature-phase DQS signals, according to at least one example embodiment.

FIG. 5 shows DQ and DQS waveforms illustrating the sampling of the DQ signals based on corresponding in-phase and quadrature-phase DQS signals, according to at least one example embodiment. As shown in FIG. 5, the quadrature-phase DQS signal 406b, the in-phase negative DQS signal 406c, and the quadrature-phase negative DQS signal 406d have, respectively, 90°, 180°, and 270° phase shifts with respect to the in-phase positive DQS signal 406a. The flip-flops are configured to sample the DQ signal 301 at the rising edges of the corresponding clock signals, e.g., 406a-406d. As such, the flip-flops 411a and 411b, having the in-phase positive and negative DQS signals 406a and 406c as clock signals, respectively, are expected to sample the DQ signal 301 at potential transition edges, e.g., rising and/or falling edges, of the DQ signal 301. The flip-flops 411c and 411d, having the quadrature-phase positive and negative DQS signals 406b and 406d as clock signals, respectively, are expected to sample the DQ signal 301 at the low-voltage and/or high-voltage phases of the DQ signal 301.

The use of multiple flip-flops, e.g., 411a-411d, in the oversampling circuit 410 enables oversampling a data signal with multiple versions, e.g., time-shifted, of the corresponding clock signal instead of employing another clock signal with higher frequency. A person skilled in the art should appreciate that the oversampling of the data signal may also be achieved by using a higher-frequency, higher than the frequency of the clock signal corresponding to the data signal, clock signal. However, using a higher-frequency clock signal may result in more energy consumption. Also, a circuit, or a hardware component, may be needed to generate the higher-frequency clock signal. The oversampling circuit 410 makes use of existing clock signals in the system 300 to oversample the data signal 301.

Figure 6A:
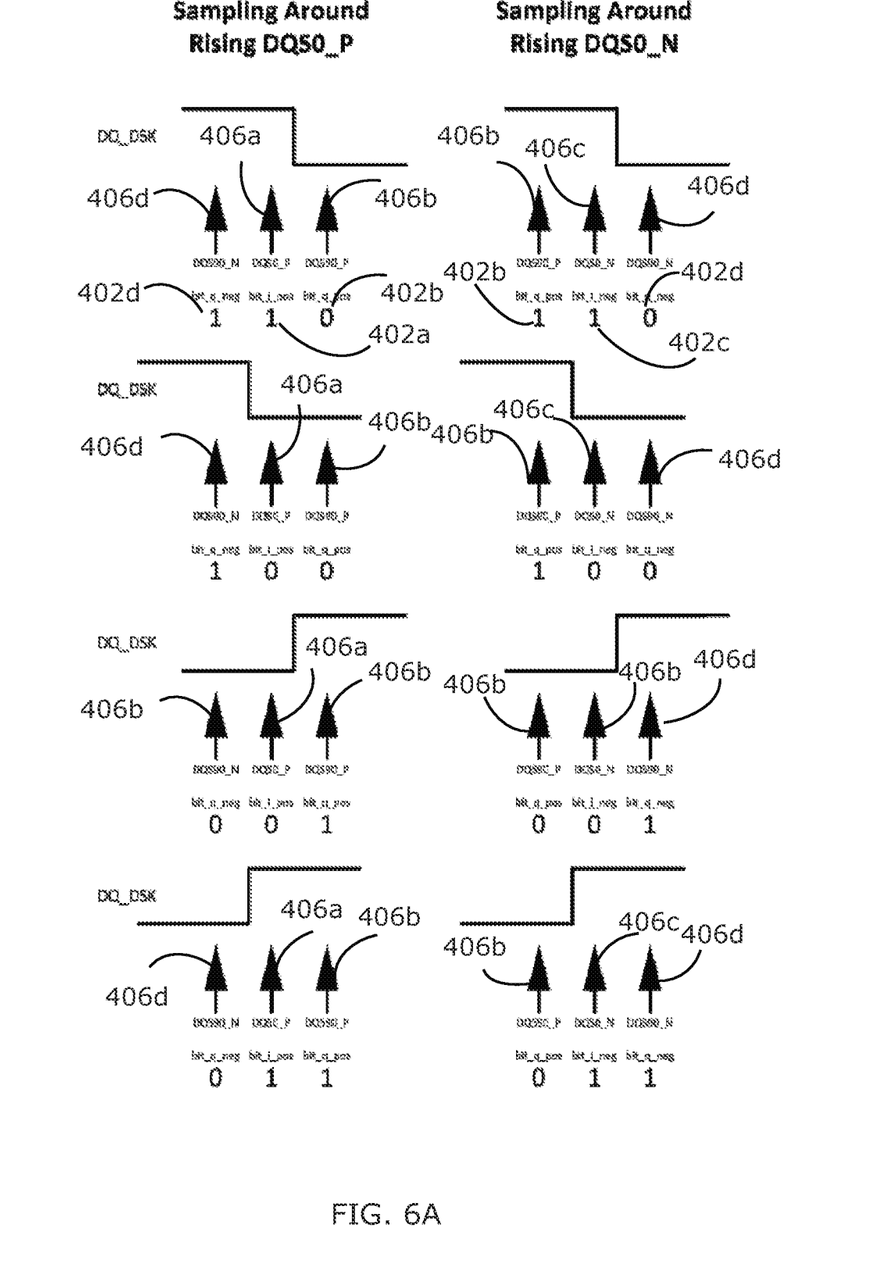
FIG. 6A shows multiple patterns of subsets of samples of the data signal, provided by the oversampling circuit, illustrating skew detection by the controller, according to at least one example embodiment.

FIG. 6A shows multiple patterns of subsets of the data signal 301, provided by the oversampling circuit 410, illustrating skew detection by the controller 420, according to at least one example embodiment. For each data bit, four samples 402a-402d, corresponding to the DQS signals 406a-406d, are provided by the oversampling circuit 410. According to at least one example embodiment, a skew in the DQ signal 301, with respect to a corresponding clock signal, is detectable only at transition edges of the data signal 301. In other words, skew, or time delay, in the data signal 301, may not be detected within a sequence of bits having the same value since the data signal 301 behaves as a constant signal within the time interval corresponding to the same sequence of bits.

The samples' patterns shown in the left column in FIG. 6A represent a first subset of data samples, e.g., 402d, 402a, and 402b, around a first potential transition edge of a bit in the data signal 301. The data samples 402d, 402a, and 402b correspond, respectively, to the DQS signals 406d, 406a, and 406b. The samples' patterns shown in the right column in FIG. 6A represent a second subset of data samples, e.g., 402b, 402c, and 402d, around a second potential transition edge of the bit in the data signal 301. The data samples 402b, 402c, and 402d correspond, respectively, to the DQS signals 406b, 406c, and 406d. As such, flip-flops 411a and 411c, having the DQS signals 406a and 406b as clock signals, respectively, are expected to sample potential transition edges of the data signal 301. As such, the corresponding data samples 402a and 402c represent the values of the data signal 301 at potential rising and/or falling edges of the data signal 301. The flip-flops 411b and 411d, having the DQS signals 406c and 406d as clock signals, respectively, are expected to sample the data signal 301 around the transition edges, e.g., at low or high voltage phases, of the data signal 301. The corresponding data samples 402b and 402d represent the values of the data signal 301 at high and/or low voltage phases of the data signal 301.

Figure 6B:
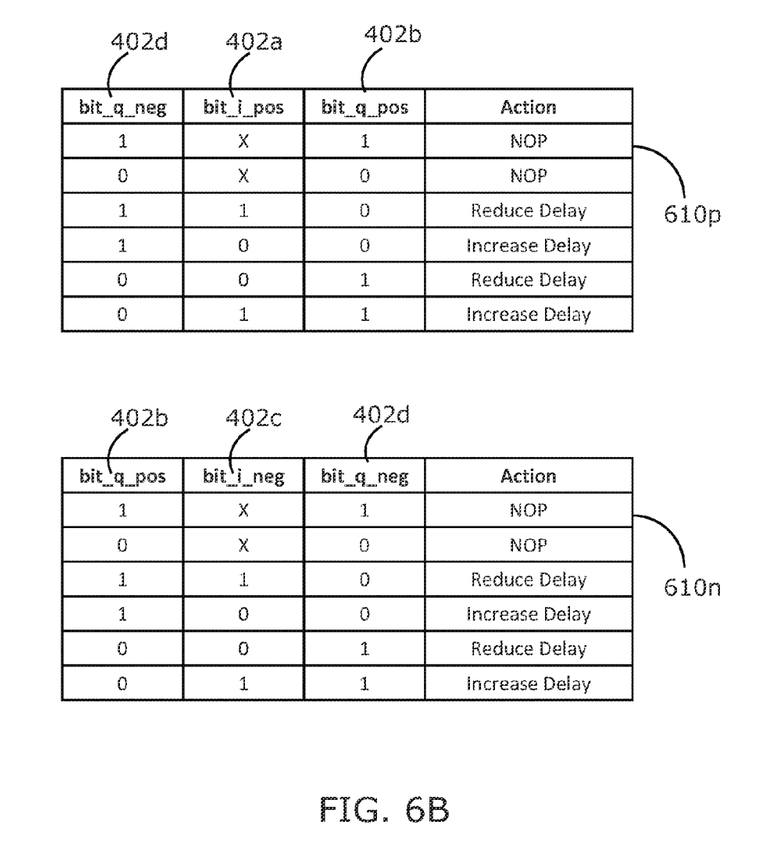
FIG. 6B shows tables illustrating determination of delay adjustment by the controller based on subsets of samples of the data signal, provided by the oversampling circuit, according to at least one example embodiment.

FIG. 6B shows tables illustrating determination of delay adjustment by the controller 420 based on subsets of samples of the data signal 301, provided by the oversampling circuit 410, according to at least one example embodiment. Table 610p corresponds to the patterns shows in the left column of FIG. 6A. Table 610n corresponds to the patterns shown on the right column of FIG. 6A. According to both Tables 610p and 610n, specifically the first two rows in each of the tables, if no transition is detected then no decision is made about skew, and therefore no adjustment is made to the variable delay line 315. If the values of the samples occurring before and after a potential bit edge are the same, then it is determined that there is no transition in the values of the corresponding consecutive bits. If the values of the samples occurring before and after a potential bit edge are different, then it is determined that there is a transition in the values of the corresponding consecutive bits and a skew is detected. If the sample corresponding to a bit edge, or potential transition edge, is the same as the previous sample, then the delay associated with the variable delay line 315 is reduced. However, if the sample corresponding to a bit edge, or potential transition edge, is the same as the following sample, then the delay associated with the variable delay line 315 is increased.

Figure 7:
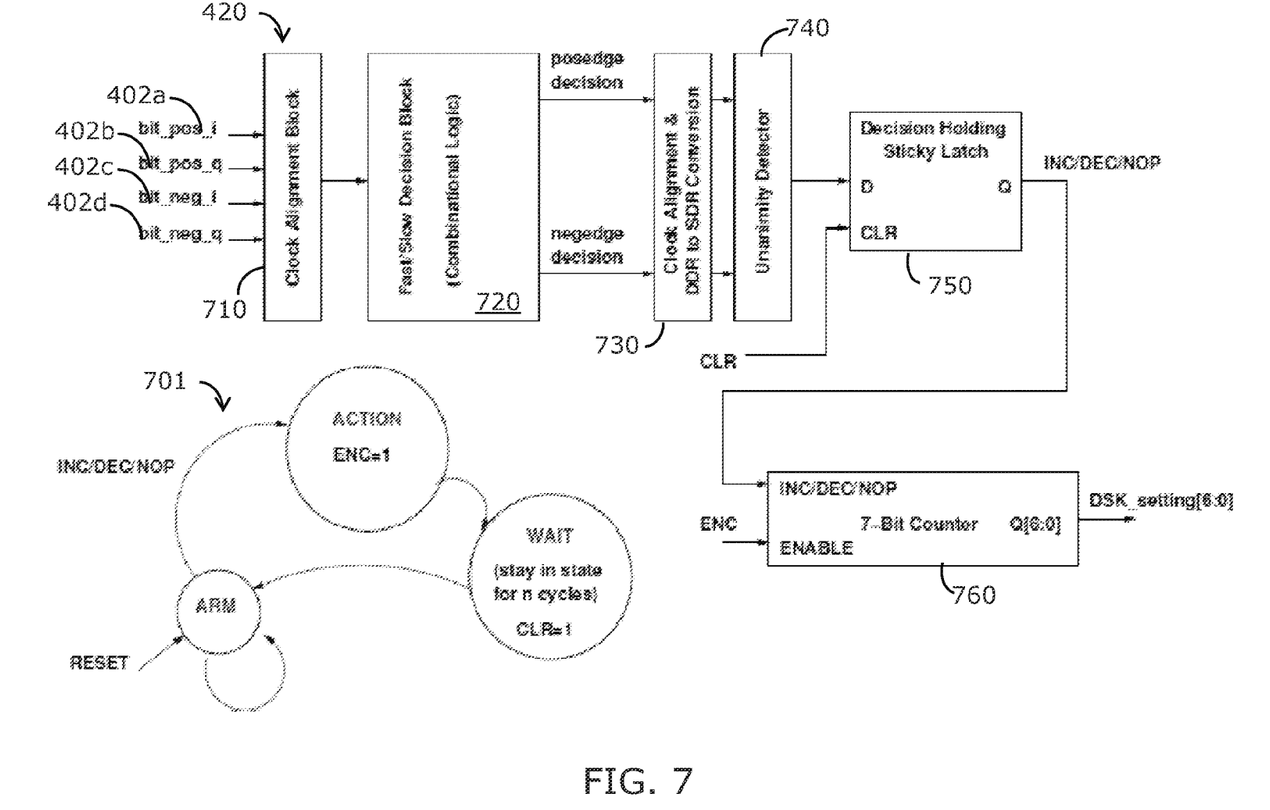
FIG. 7 is a block diagram illustrating an example implementation of the controller 420, according to at least one example embodiment.

FIG. 7 is a block diagram illustrating an example implementation of the controller 420 and a corresponding finite state machine 700, according to at least one example embodiment. There are four incoming samples 402a-402d from the first line of flip-flops 411a-411d (FIG. 4). The samples 402a-402d are time-aligned by a clock alignment module 710, and the corresponding values are passed to a decision block 720. The decision block 720 is configured to use two subsets of samples, each with three samples and make a separate skew decision for each subset. The decision block 720 makes a separate decision for the in-phase positive DQS data bit versus the in-phase negative DQS data bit. The subsets are selected as shown in FIG. 6A. The possible decisions provided by the decision block 720 include a decision from Table 610p and another from Table 610n (FIG. 6B).

Then, an additional clock alignment block 730 is employed to synchronize both decisions on a single clock edge so that downstream processing based on a collective decision can be aligned on a cycle boundary. The unanimity detector 740 produces the final decision taking into account both previous decisions. An action, e.g., delay increment or delay decrement, is issued only if both previous decisions, based on a positive edge DQ and a negative edge DQ, are unanimous. The decision is stored in a sticky latch 750. A state diagram of a finite state machine (FSM) 700 corresponding to the control logic is also shown in FIG. 7. The FSM 700 resets to the ARM state. As soon as a decision is available in the sticky latch 750, the FSM goes to the ACTION state and updates the 7-bit counter 760 that holds the variable delay line settings. The counter will either increment or decrement based on the decision held in the sticky latch 750. If no transition edge is detected, or if the two decisions provided by the decision block 720 are not consistent, then no adjustment (NOP) is made to the variable delay line 315 (FIG. 3). Then, the FSM 700 goes into a WAIT state and stays there for a number of cycles. During that time, the variable delay lines are updated and the effect of the decision is propagated throughout the entire decision pipeline. Moreover, during the WAIT cycles, the sticky latch 750 is reset and is ready to accept the next decision. After the WAIT cycles are over, the FSM 700 moves to the ARM state and is ready to process the next decision.

An optional LOCK state may be introduced to the FSM 700 in addition to circuitry that maintains a history of what direction the delay line is moving, e.g., increasing or decreasing delay. When a change in direction is detected, it is an indication that the minimum skew has been approached and passed. In this case, the FSM 700 may move to the LOCK state and stay there forever until a complete system RESET. The deskew mechanism may be frozen so that no further updates to the delay lines are made after the initial deskew procedure. The decision of whether to make the deskew procedure perpetual or single occurrence post RESET through the implementation of the LOCK state is left to the memory system designer.

The setup time margin for the memory controller flops that sample the DQ data signals with the DQS strobe signal may be expressed as the following equation:

$$t_{setup\_margin} = \frac{1}{4} t_{cycle} - t_{setup} - t_{skew} \quad (1)$$

The quarter clock cycle comes from the 90 degree phase shift between DQS and DQ to ensure that DQS samples in the middle of the DQ signal on both the rising and falling edge as was shown in FIG. 2. The setup time at the DQS versus DQ is $t_{setup}$, $t_{skew}$ is the total systematic and process skew accumulated between the memory component and the memory controller:

$$t_{skew} = T_{DQSQ} + T_{module\_trace\_skew} + t_{controller\_package\_skew} + t_{controller\_1/4cycle\_skew} \quad (2)$$

Where $T_{DQSR}$ is the DQS to DQ skew per byte group per access output from the memory component 120. The other parameters in the $t_{skew}$ equation are: the skew generated by imperfect layout matching inside the memory module which is made up of several memory components on a PCB ($t_{module\_trace\_skew}$), the skew generated by imperfect layout matching on the PCB board that connects the memory module to the memory controller ($t_{PCB\_trace\_skew}$), the skew generated by imperfect matching in memory controller's package ($t_{controller\_package\_skew}$), and the skew of 90 degree phase shift on DQS vs DQ ($t_{controller\_1/4cycle\_skew}$). At 2400 Mega transitions per second (MT/s), assuming $T_{DQSQ}$ is estimated to be about 65 Pico second (ps) while $t_{module\_trace\_skew}$, $t_{PCB\_trace\_skew}$, $t_{controller\_package\_skew}$, and $t_{controller\_1/4cycle\_skew}$ are about 5 ps, 10 ps, 5 ps, and 25 ps, respectively, a total systematic skew ($t_{skew}$) of about 110 ps at 2400 MT/s, which is usually able to be reduced to under 10 ps by the realignment system 300. As an example of how the setup margin can be increased by a reduction in the systematic skew at 2400 MT/s, equation 1 is used to compare the setup margin before and after bit deskewing. Assuming $t_{setup}$ from the memory controller is 50 ps, the results can be shown as follows:

$$t_{setup\_margin\_no\_deskew} = 208.33 - 50 - 110 = 58.33 \text{ ps} \quad (3)$$

$$t_{setup\_margin\_with\_deskew} = 208.33 - 50 - 10 = 148.33 \text{ ps} \quad (4)$$

The setup margin gets increased from 58.33 ps to 148.33 ps as a result in this example. This margin is important as there are other random components of skew, which are not easily accounted for in the design, such as power supply noise, inter-symbol interference (ISI), simultaneous switching noise (SSN), etc. These random components of skew are highly dependent upon the system design and may be hard to control with design geometry being smaller and density being higher. Furthermore, by providing a bigger margin also implies higher data rate than 2400 MT/s is also plausible.

According to at least one example embodiment, embodiments of the realignment system 300 provide a significant improvement in setup and hold time margin for state of the art high speed memory interface with minimum hardware addition by reducing systematic skew between the DQS and DQ signals. The realignment system, e.g., 300, allows locking on to the minimum skew or perpetually update the deskew delay lines so that it can react to changes in the environment resulting from variations on voltage and temperature conditions.

A person skilled in the art should appreciate that other embodiments of the realignment system 300, the corresponding realignment component 400, and/or any corresponding realignment processes are also possible. For example, a single subset of data samples, associated with a single bit edge, may be employed in detecting skew in the data signal, with respect to the corresponding clock signal. In such case the clock alignment block 730 and the unanimity block 740 may be omitted. Alternatively, more than two subsets of data samples, e.g., with more than two bits' edges, may be employed in detecting skew in the data signal. Also, the number of samples in each subset of samples may be different from three, e.g., five or seven, in which case different shifted versions of the DQS signal are employed in oversampling the data signal 301.

A person skilled in the art should appreciate that realignment, or deskew, may be applied to a subset of the data signals, and not necessarily all data signals 301*a*-301*h*. It should also be appreciated that the signal realignment embodiments presented herein are not restricted to data signals and corresponding clock signals, but may also be applied to synchronize other signals.

While this invention has been particularly shown and described with references to example embodiments thereof, it will be understood by those skilled in the art that various changes in form and details may be made therein without departing from the scope of the invention encompassed by the appended claims.

What is claimed is:

1. A method of aligning a data signal with a corresponding clock signal, the method comprising:
   oversampling the data signal based on the corresponding clock signal;
   detecting an indication of a skew between the data signal and the corresponding clock signal based on the oversampling; and
   adjusting a variable delay line coupled to the data signal based on the indication of skew detected, the variable delay line being decoupled from the corresponding clock signal.

2. The method of claim 1, wherein oversampling the data signal based on the corresponding clock signal includes sampling the data signal based on the corresponding clock signal and multiple time-shifted versions of the corresponding clock signal.

3. The method of claim 2, wherein at least one signal of the corresponding clock signal and the multiple time-shifted versions of the corresponding clock signal is employed in sampling the data signal at a potential transition edge of the data signal.

4. The method of claim 1, wherein detecting an indication of skew between the data signal and the corresponding clock signal includes:
selecting a subset of samples acquired by the oversampling; and
determining whether or not there is a skew in the data signal, with respect to the corresponding clock signal, based on the selected subset of samples.

5. The method of claim 4, wherein at least one sample of the selected subset of samples is associated with a potential transition edge of the data signal.

6. The method of claim 5, wherein determining whether or not there is a skew in the data signal includes determining whether or not there is a skew in the data signal based on the value of the at least one sample associated with the potential transition edge of the data signal.

7. The method of claim 1, wherein detecting an indication of skew between the data signal and the corresponding clock signal includes:
selecting two or more subsets of samples acquired by the oversampling; and
determining whether or not there is a skew in the data signal, with respect to the corresponding clock signal, based on the selected two or more subsets of samples.

8. The method of claim 7, wherein a sample of each of the selected two or more subsets of samples is associated with a corresponding potential transition edge of the data signal.

9. The method of claim 8, wherein determining whether or not there is a skew in the data signal includes determining whether or not there is a skew in the data signal based on the values of the samples associated with corresponding potential transition edges of the data signal in each of the two or more selected subsets.

10. The method of claim 1, wherein adjusting the variable delay line based on the skew indication detected includes incrementing or decrementing an indication of a delay associated with the variable delay line.

11. The method of claim 1 further comprising:
upon adjusting the variable delay, waiting for a number of cycles; and
repeating the oversampling, the detecting and the adjusting.

12. An apparatus for aligning a data signal with a corresponding clock signal, the apparatus comprising:
an oversampling circuit configured to oversample the data signal based on the corresponding clock signal; and
a controller configured to:
detect an indication of a skew between the data signal and the corresponding clock signal based on the oversampling;
adjust a variable delay line coupled to the data signal based on the indication of skew detected, the variable delay line being decoupled from the corresponding clock signal.

13. The apparatus of claim 12, wherein the oversampling circuit includes multiple flip-flops configured to sample the data signal based on multiple other clock signals, the multiple other clock signals include the corresponding clock signal and multiple time-shifted versions of the corresponding clock signal.

14. The apparatus of claim 13, wherein at least one signal of the multiple other clock signals is employed in sampling the data signal at a potential transition edge of the data signal.

15. The apparatus of claim 12, wherein in detecting an indication of skew between the data signal and the corresponding clock signal, the controller is further configured to:
select a subset of samples acquired by the oversampling; and
determine whether or not there is a skew in the data signal, with respect to the corresponding clock signal, based on the selected subset of samples.

16. The apparatus of claim 15, wherein at least one sample of the selected subset of samples is associated with a potential transition edge of the data signal.

17. The apparatus of claim 16, wherein in determining whether or not there is a skew in the data signal, the controller is further configured to determine whether or not there is a skew in the data signal based on the value of the at least one sample associated with the potential transition edge of the data signal.

18. The apparatus of claim 12, wherein in detecting an indication of skew between the data signal and the corresponding clock signal, the controller is further configured to:
select two or more subsets of samples acquired by the oversampling; and
determine whether or not there is a skew in the data signal, with respect to the corresponding clock signal, based on the selected two or more subsets of samples.

19. The apparatus of claim 18, wherein a sample of each of the selected two or more subsets of samples is associated with a corresponding potential transition edge of the data signal.

20. The apparatus of claim 19, wherein in determining whether or not there is a skew in the data signal, the controller is further configured to determine whether or not there is a skew in the data signal based on the values of the samples associated with corresponding potential transition edges of the data signal in each of the two or more selected subsets.

21. The apparatus of claim 12, wherein in adjusting the variable delay line based on the skew indication detected, the controller is further configured to increment or decrement an indication of a delay associated with the variable delay line.

22. The apparatus of claim 12, wherein the controller is further configured to:
upon adjusting the variable delay, wait for a number of cycles; and
repeat the detecting the indication of a skew and adjusting the variable delay line.

23. The method of claim 6, further comprising:
determining that there is a skew in the data signal when the values occurring before and after the potential transition edge of the at least one sample are different.

24. The method of claim 23, wherein adjusting the variable delay line comprises:
incrementing the delay associated with the variable delay line when the at least one sample corresponding to the potential transition edge is the same as a following sample in the subset of samples; and
decrementing the delay associated with the variable delay line when the at least one sample corresponding to the potential transition edge is the same as a previous sample in the subset of samples.

25. The method of claim 9, further comprising:
    making a skew decision for each of the two or more selected subsets, the skew decision corresponding to a decision to increment or decrement the delay associated with the variable delay line; and
    adjusting the variable delay line only when the skew decision made for each of the two or more selected subsets is the same.

26. The apparatus of claim 17, wherein the controller is further configured to determine that there is a skew in the data signal when the values occurring before and after the potential transition edge of the at least one sample are different.

27. The apparatus of claim 26, wherein in adjusting the variable delay line, the controller is further configured to:
    increment the delay associated with the variable delay line when the at least one sample corresponding to the potential transition edge is same as a following sample in the subset of samples; and
    decrement the delay associated with the variable delay line when the at least one sample corresponding to the potential transition edge is same as a previous sample in the subset of samples.

28. The apparatus of claim 12, wherein in detecting an indication of skew between the data signal and the corresponding clock signal, the controller is further configured to:
    select two or more subsets of samples acquired by the oversampling;
    make a skew decision for each of the two or more selected subsets, the skew decision corresponding to a decision to increment or decrement a delay associated with the variable delay line; and
    further adjust the variable delay line coupled to the data signal based on the indication of skew detected and only when the skew decision made for each of the two or more selected subsets is the same.

* * * * *